United States Patent
Chiappetta et al.

(10) Patent No.: US 9,584,074 B2
(45) Date of Patent: Feb. 28, 2017

(54) OPTICAL RECEIVER WITH AUTOMATIC DISTORTION CANCELLATION

(75) Inventors: Joseph F. Chiappetta, Shelton, CT (US); Marcel F. Schemmann, Marea Hoop (NL)

(73) Assignee: ARRIS Enterprises, Inc., Suwanee, GA (US)

( * ) Notice: Subject to any disclaimer, the term of this patent is extended or adjusted under 35 U.S.C. 154(b) by 1064 days.

(21) Appl. No.: 12/371,356

(22) Filed: Feb. 13, 2009

(65) Prior Publication Data

US 2009/0202255 A1    Aug. 13, 2009

Related U.S. Application Data

(60) Provisional application No. 61/065,673, filed on Feb. 13, 2008.

(51) Int. Cl.
*H04B 10/69* (2013.01)
*H03F 3/08* (2006.01)

(52) U.S. Cl.
CPC .......... *H03F 3/082* (2013.01); *H04B 10/697* (2013.01); *H03F 2200/534* (2013.01); *H03F 2200/537* (2013.01); *H03F 2200/541* (2013.01)

(58) Field of Classification Search
CPC .............. H03F 3/082; H03F 2200/541; H03F 2200/537; H03F 2200/534

USPC ................ 398/193–194, 208–209, 213, 147
See application file for complete search history.

(56) References Cited

U.S. PATENT DOCUMENTS

| | | | |
|---|---|---|---|
| 5,418,637 A * | 5/1995 | Kuo | H04B 3/06 398/159 |
| 5,424,680 A * | 6/1995 | Nazarathy | H03F 1/3252 327/133 |
| 5,481,389 A * | 1/1996 | Pidgeon | H03F 1/32 332/160 |
| 6,337,711 B1 * | 1/2002 | Dickinson | H04N 17/00 348/183 |
| 6,687,466 B1 | 2/2004 | Chiappetta | |
| 7,792,183 B2 * | 9/2010 | Massey | H04B 17/309 375/227 |
| 2004/0213573 A1* | 10/2004 | Schemmann et al. | .......... 398/66 |
| 2007/0297803 A1* | 12/2007 | Peral | H03F 1/32 398/140 |
| 2008/0112709 A1* | 5/2008 | Oulianov et al. | .............. 398/159 |
| 2009/0196630 A1* | 8/2009 | Ishaug et al. | ................ 398/193 |

* cited by examiner

Primary Examiner — Leslie Pascal
(74) Attorney, Agent, or Firm — Lori Anne D. Swanson

(57) ABSTRACT

An optical receiver includes closed-loop composite second order (CSO) distortion correction logic. An optical communication system includes a transmitter comprising open-loop composite second order (CSO) distortion correction logic, and a receiver comprising closed-loop composite second order (CSO) distortion correction logic.

21 Claims, 8 Drawing Sheets

OPTICAL RECEIVER WITH AUTOMATIC DISTORTION CANCELLATION

PRIORITY CLAIM

This application claims priority under 35 USC 119 to U.S. provisional application No. 61/065,673 filed on Feb. 13, 2008, which is incorporated herein by reference.

BACKGROUND

In a typical optical link that is transporting many radio frequency (RF) carrier channels, there exists composite second order distortion (CSO) components. The CSO components result from inherent nonlinearity of the link components, laser chirp interactions, and other effects. In one application, for example, CSO distortions primarily appear at +/−1.25 Mhz offsets from either side of the carrier center frequencies, and in another application the CSO distortions appear +/−750 kHz offsets from the carrier when the frequencies are spaced differently than 6 Mhz. These components follow the $(f_x-f_y)$ and $(f_x+f_y)$ rule for every carrier frequency, whereby $f_x$ and $f_y$ are combinations of any two different frequencies in the total band transmitted.

Another way in which even-order CSO distortion manifests itself is by the $(f_{n+1}-f_n)$ rule. This rule states that a distortion product is generated for every pair of RF frequencies that are adjacent to each other. A typical optical system may operate with cable television (CATV) National Television System Committee (NTSC) RF carrier frequencies. The majority of these carrier frequencies are nominally equally spaced at 6.00 Mhz intervals, within a tolerance of less than +/−30 Khz. The actual spacing between carriers depends on the absolute frequency accuracy of each individual carrier. This results in many distortion products that fall within the 6.00 Mhz+/−30 Khz frequency range (e.g. when detected using a photodiode). For a system transmitting N carriers, there will be (N−1) of these CSO 6.00 Mhz difference signals, or 'beats'. For other channel plans, such as European PAL format, the channel spacing will be different at 7.00 Mhz or 8.00 Mhz, with corresponding CSO beat products.

A measure of the energy in all these 6.00 Mhz beat frequencies is indicative of the even-order distortion present on the optical link. If these 6.00 Mhz components are monitored and a mechanism exists that reduces their magnitude, then the other CSO components falling at +/−1.25 Mhz on either side of the carriers may also be reduced.

U.S. Pat. No. 6,687,466 describes automatic distortion cancellation in an optical transmitter.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the FIG. number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

Techniques, devices, and systems in accordance with the principles described herein may be applied to reduce CSO and CTB distortion in a cable plant at an optical receiver located in or near an optical node. CSO and CTB distortion may be reduced in the presence of laser distortions, fiber dispersion induced distortions, optical passives induced distortions, and the optical non-linearities induced distortions collectively, individually or in any combination, and for example over the temperature range of −40 to +85 C and in wavelength regions around 1310 nm and/or 1550 nm. Various general techniques may be used to reduce the distortion, including pre-distortion techniques, and/or feed forward techniques, and/or automatic microprocessor controlled techniques.

Figure 1:
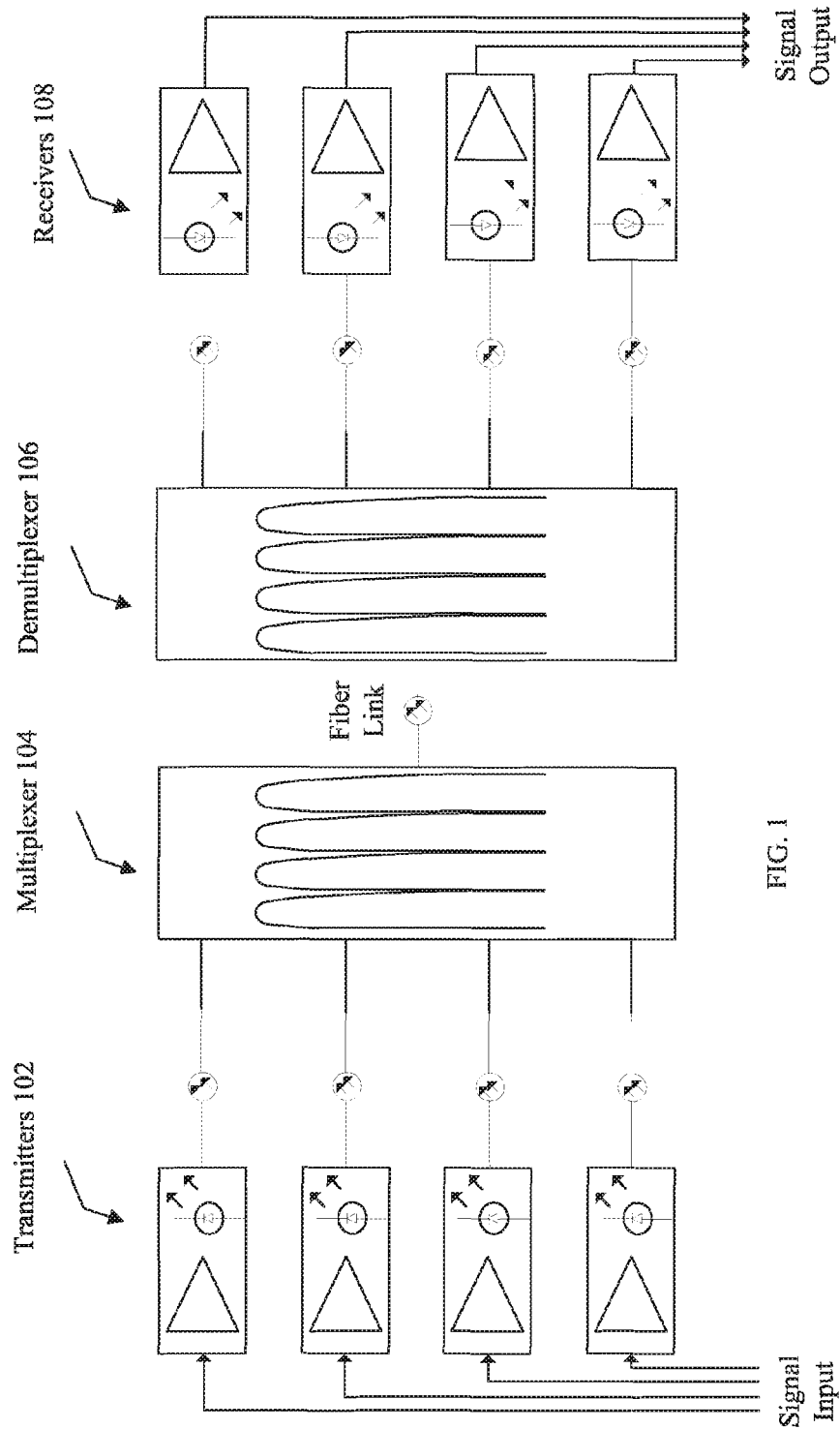
FIG. 1 is a block diagram of an embodiment of a transmitter/receiver system that may be disposed in a communication network.

Disclosed herein are embodiments of an optical receiver that uniquely incorporates automatic distortion cancellation functionality. A receiver in accordance with these principles may be disposed in an optical transmission system that includes various active and passive optical elements. A representation of a very basic optical system that may comprise such an optical receiver is shown in FIG. 1. The receiver incorporates a closed loop composite second order (CSO) distortion cancellation circuit that continuously and automatically monitors and minimizes receiver output distortion. In some embodiments, cancellation of the receiver's output distortion and consequently the optical system distortion is accomplished for many types (sources) of CSO generated distortion. CSO distortion may result from fiber non-linearity due to high input launch power, and is generated by the effects of cross-phase modulation, and stimulated Raman scattering. Additional components of CSO distortion typically result from the transmitter's laser chirp (frequency-phase modulation) interacting with imperfect optical channel flatness and with fiber dispersion, and also by the inherent nonlinearity of other link components. The cancellation loop works to continuously and automatically reduce these CSO distortions.

In most WDM systems there are CSO products that result from wavelength interaction, in addition to the CSO products that result from the signals at any specific wavelength. In many cases, the information content of the different wavelengths is different, such that the CSO products that result from interaction between different wavelengths have a very poor correlation to those that result from interactions within one wavelength. Furthermore, even when the information content on the different wavelengths is identical, there usually is a significant delay difference between the signals on the different wavelengths. This in turn causes a strong de-correlation of the distortions resulting from inter-wavelength interactions compared to those resulting from a single wavelength.

The receiver distortion compensation logic typically operates with information present on the wavelength of interest. It is thus generally difficult to create a distortion compensation signal that eliminates distortions from multi-wavelength interaction. This might be possible in the case of a multi-wavelength system carrying the same signals in at least part of the band. However, it would typically require the use of enough memory to accommodate the delay difference between those signals and thus lead to considerably more complex implementations.

In practice the distortion compensation scheme of the receiver will in some cases minimize distortion that results from the wavelength it is operating on against a background of uncorrelated distortions. The uncorrelated distortions may be detected using the power measurement methods described herein. However when a coherent distortion detection method is used, distortion measurement may differentiate between distortions correlated with the distortion that the distortion generator in the receiver creates, and uncorrelated distortions. A coherent distortion detection mechanism generates an expected distortion product and determines the correlation between that expected distortion product and the incoming signal (for feed-forward compensation) or outgoing signal (for feedback cancellation). Distortion minimization techniques discussed herein may thus still be applied. Furthermore, coherent distortion may be used to specifically differentiate between different distortion contributions such as filter distortion and fiber chromatic dispersion distortion. That is because these distortions have a very different signature and thus can be separated by determining correlation with a filter-distortion-like signal generated in the receiver and a fiber-distortion-like signal generated in the receiver.

Techniques, devices, and systems for CSO distortion are described herein in terms of CATV National Television System Committee (NTSC) RF carrier frequencies. The majority of these carrier frequencies are nominally equally spaced at 6.00 Mhz intervals. For other channel plans, such as European PAL format, the channel spacing is at 7.00 Mhz or 8.00 Mhz, with corresponding CSO beat products. The reduction of these distortion components is typically accomplished in manners similar to those described for the 6.00 Mhz spacing, except that the input filter to the control loop as explained below are changed to match the particular band of distortions. In other words, the reduction of CSO distortion in an optical link is not limited to just monitoring and controlling 6, 7, or 8 Mhz components.

FIG. 1 is a block diagram of an embodiment of a transmitter/receiver system that may be disposed in a communication network. Such an arrangement is suitable for use, for example, in an optical communication network, for example by cable television companies. Transmitter 102 receives a signal stream and provides it to a multiplexer 104. The transmitter 102 to multiplexer 104 link is typically optical or electrical. The multiplexer 104 receives signal streams from multiple transmitters 102. The multiplexer 104 multiplexes the multiple streams, for example, using frequency divisional multiplexing or time divisional multiplexing, onto a single physical carrier, such as an optical cable or optical fiber, by which the multiplexed signals are transmitted to a demultiplexer 106. The demultiplexer 106 demultiplexes the multiplexed signal into the respective individual streams provided by the individual transmitters 102. These streams are provided to receivers 108, which perform distortion correction and provide the signal to the receiver-local environment.

The transmitter 102 comprises distortion correction logic, particularly for correction of laser and amplifier non-linearities and predistortion correction of fiber nonlinearities. In various embodiments in accordance with the present invention, the transmitter 102 comprises open-loop and/or closed loop distortion correction logic for one or more of laser nonlinearity, amplifier, or fiber nonlinearity, or distortion correction only for laser nonlinearities, or no distortion correction logic at all.

Figure 2:
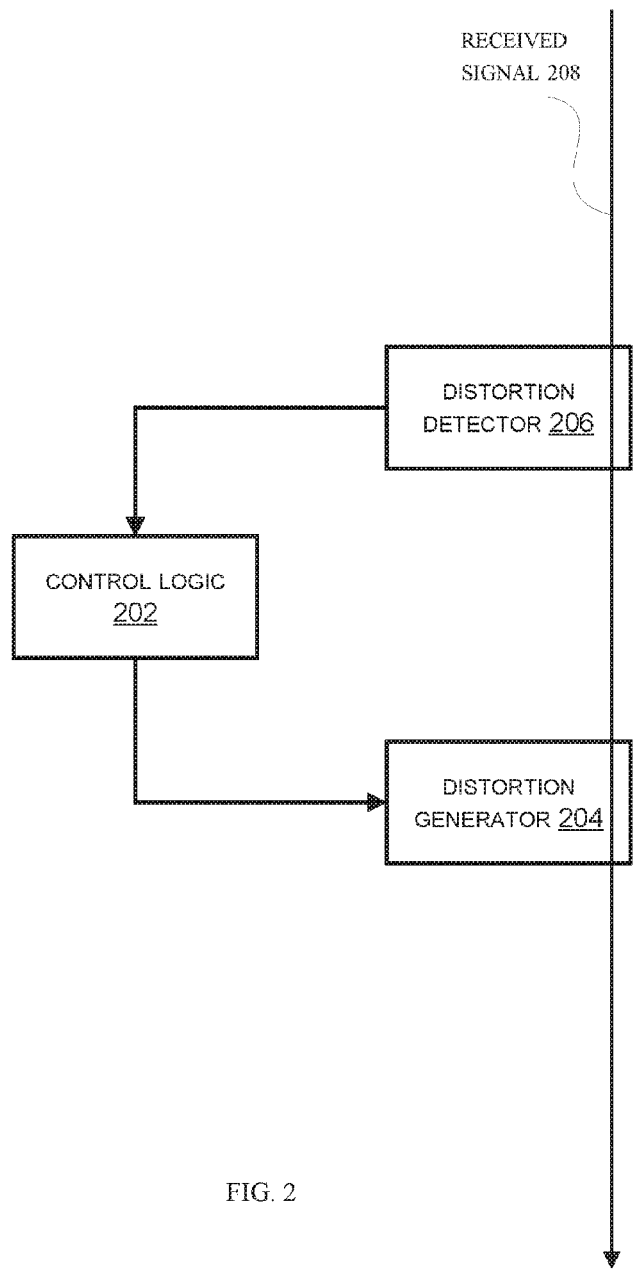
FIG. 2 is a block diagram of an embodiment of the distortion correction logic that may be disposed within a receiver.

FIG. 2 is a block diagram of an embodiment of the distortion correction logic that may be disposed within a receiver 108. The receive signal is obtained from a physical carrier and provided to a distortion detector 206. Distortion detector 206 provides a measurement of the distortion to control logic 202. The control logic 202 controls the distortion generator 204 based upon the detected distortion, and the distortion signal provided by the distortion generator 204 is provided back to the physical carrier to modify the signal thereon to reduce distortion in the receiver 108.

Figure 3:
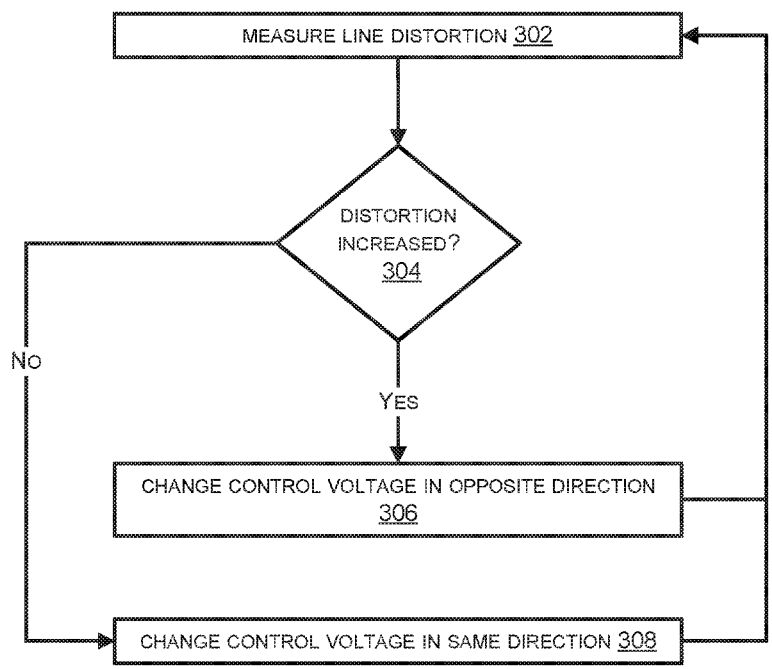
FIG. 3 is a flow chart of an embodiment of a process to correct distortion in a signal receiver.

FIG. 3 is a flow chart of an embodiment of a process to correct distortion in a signal receiver. At 302 the line distortion is measured. For CATV NTSC signals, a measure of the energy in the 6.00+/−0.03 Mhz frequency band is typically representative of the even-order composite second order (CSO) distortion of the optical link that supplies the receiver. The extraction (detection) of this distortion energy from the transmitted optical signal is accomplished in the optical receiver. If, at 304, the line distortion has increased from a previous measurement of the line distortion, a control voltage is adjusted in the opposite direction of the last adjustment, and provided by the control logic to the distortion generator (e.g. assuming the prior adjustment was a decrease in control voltage that increased the distortion, the next adjustment would be an increase in control voltage).

Otherwise, if decreasing distortion has been measured, an adjustment to the control voltage in the same direction as the previous adjustment is applied (e.g. if the prior adjustment in control voltage was an increase, and decreased distortion resulted, the next adjustment would also be a control voltage increase). In this manner, the control logic will drive the distortion generator to produce a counter distortion signal that minimizes the distortion measured from the physical carrier.

In accordance with the present invention, the receiver reduces its own distortion so that the internal automatic CSO cancellation circuitry needs only to respond to external link distortions and not the receiver generated distortions. In some cases, the receiver CSO compensation logic also minimizes receiver distortions.

Figure 4:
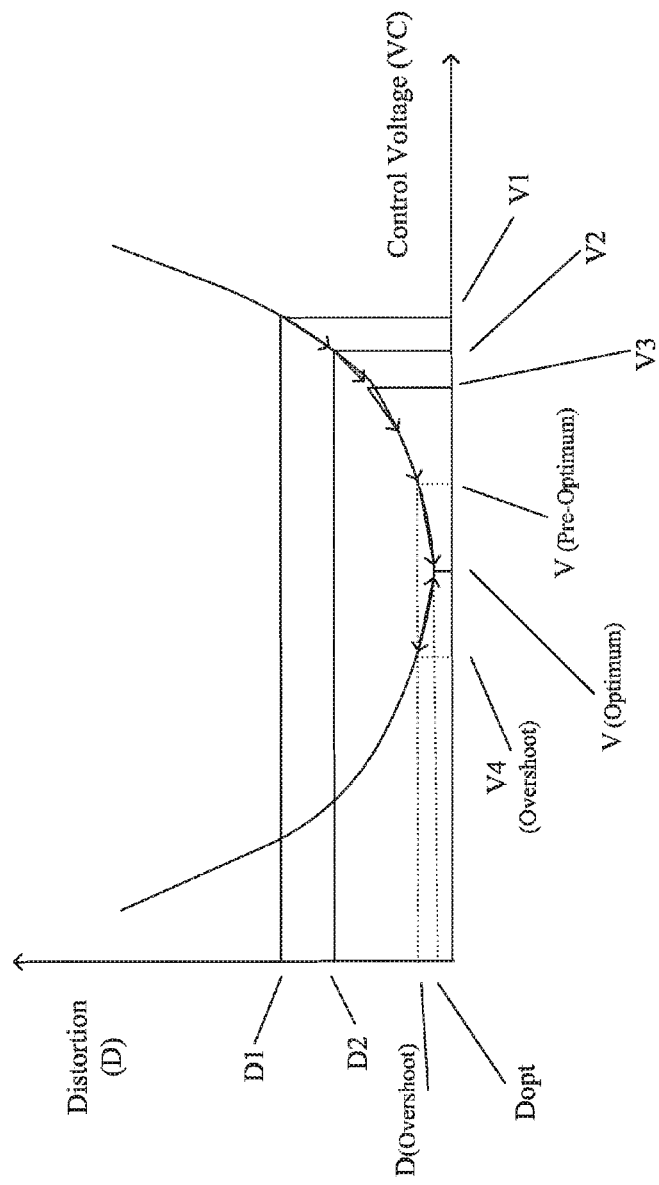
FIG. 4 is an illustration of an embodiment of a process of adjusting the control voltage of CSO generation logic.

FIG. 4 is an illustration of an embodiment of a process for adjusting the control voltage of CSO generation logic. An initial control voltage is provided to the distortion generator. This initial voltage V1 is a preset (seed) value that presupposes an optimum setting. Due to temperature and component aging, the preset voltage V1 is typically not the final value that is established. At this setting, the distortion detection logic feeds back a distortion value D1 to the control logic. The control logic next outputs a voltage V2 that is higher or lower lower than V1, and monitors the corresponding distortion voltage D2. In the illustrated example, the voltage V2 is lower than V1, and the distortion D2 is lower than D1. Because D2 is lower than D1 for a lower control voltage, lowering the control voltage was the correct direction to take. Had the distortion been higher for a lower control voltage, the next control voltage V3 is set higher than V1. In this case, V3 is set lower than V2. This iterative process continues until the control voltage becomes $V_{(Optimum)}$ for a corresponding distortion value $D_{(Optimum)}$. At this point a control voltage $V_{(Overshoot)}$ is output for a distortion value $D_{(Overshoot)}$. $D_{(Overshoot)}$ is higher than the optimum value that was previously monitored. Because the current distortion is higher than the previous distortion, the next output voltage is set to return to the previous value $V_{(Optimum)}$. Once a valley area is reached, control voltages are output on either side of $V_{(Optimum)}$ in a manner that keeps the loop operating at the valley (optimum point) of the distortion vs. control voltage characteristic.

In some cases, distortion components change phase as a result of various external influences. One result can be an abrupt phase change of 180 degrees when the wavelength of a signal-generating laser drifts to a point on the optical filter in the multiplexer or de-multiplexer that has a flatness signature slope that is opposite to that where the laser was previously operating. To maintain distortion minimization the control logic in some embodiments readjusts its phase by 180 degrees to track the system distortion. In one embodiment, the control logic applies the minimization techniques described in conjunction with FIG. 4, and stores the minimized distortion value in memory. The control logic then switches in a 180 degree phase shift in the generated distortion path and repeats the minimization routine again, storing the minimized value in memory. The two minimums are compared and the lower of the two establishes whether the switched in phase change is needed or not. The control logic then sets the phase that gives the lowest minimum. Because the transition through the filter slope is at or close to the minimum point of the filter/chirp generated distortion, the switching of the phase causes minimal change to the magnitude of the receiver output distortion at the new phase point. Of course, phase swings other than 180 degrees are also possible and may be dealt with similarly.

Figure 5:
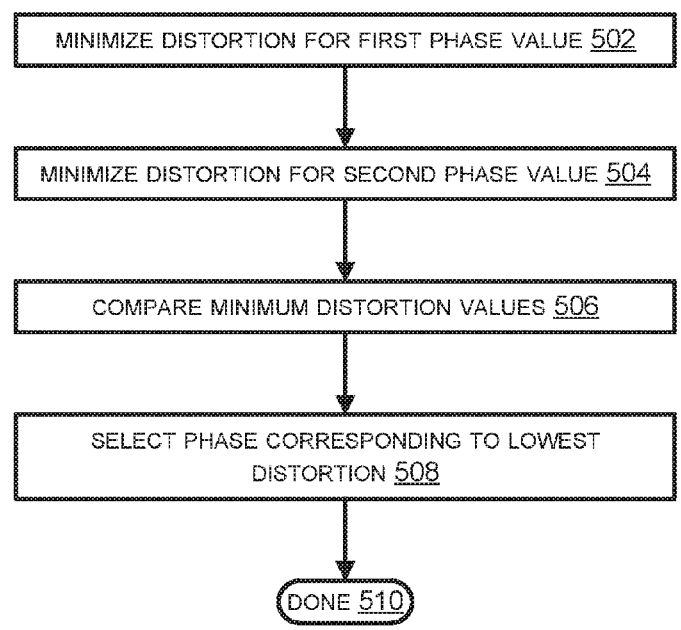
FIG. 5 is a flow chart of an embodiment of a process of adapting to phase swings in the signal.

FIG. 5 is a flow chart of an embodiment of a process of adapting to phase swings in the signal. At 502 the distortion is minimized for a first distortion phase value. At 504 the distortion is minimized for a second phase value, for example, a phase value 10 degrees out of phase from the first phase value. The two minimum distortion values are compared at 506. The distortion phase that results in the lower distortion value is selected at 508. At 510 the process concludes. Although demonstrated for two phase values, e.g. 10 degrees out of phase, the process may be applied to any number or degrees of phase values, with a minimum or a group minimum being selected therefrom as the phase value to apply to minimize distortion.

Figure 6:
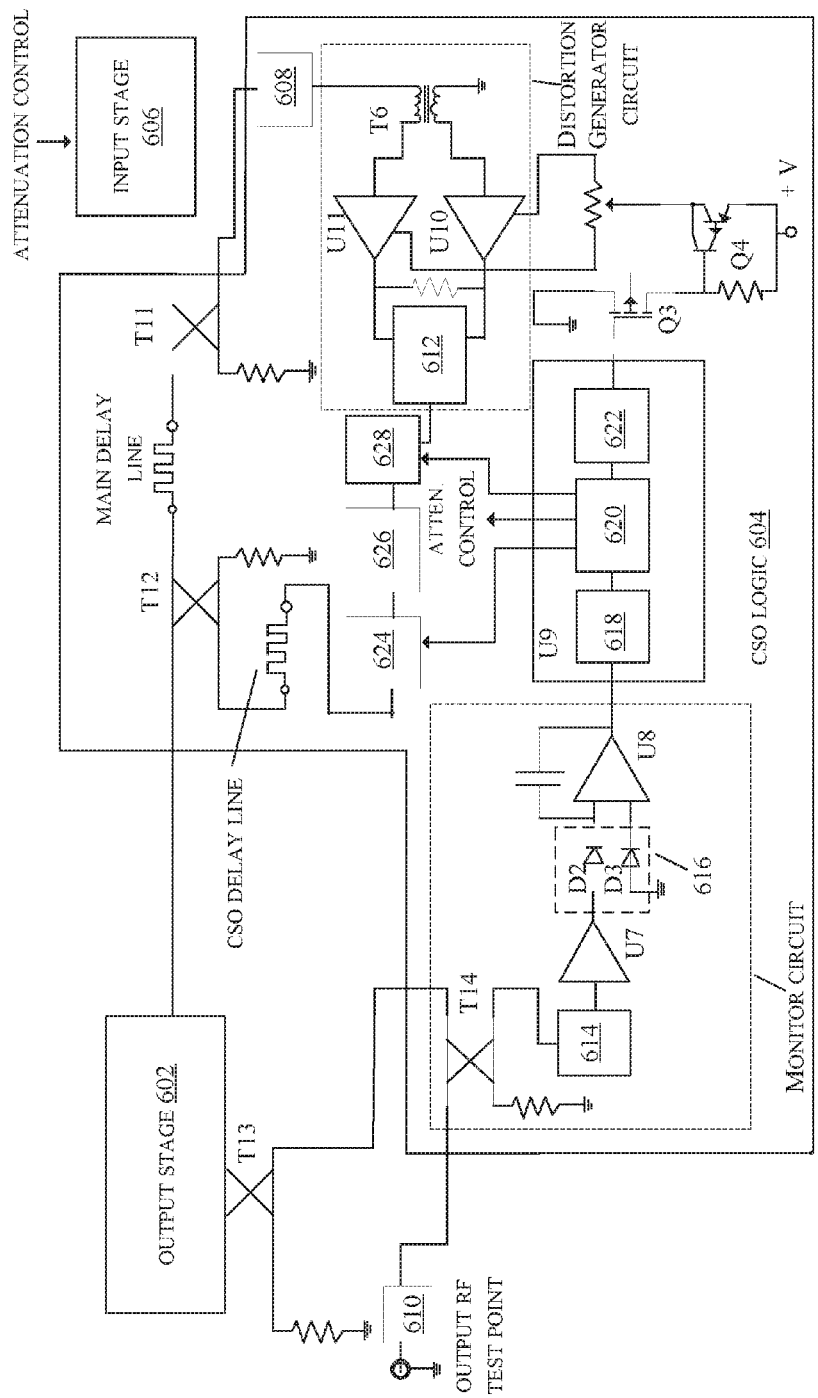
FIG. 6 illustrates one possible embodiment of CSO cancellation logic in a receiver.

FIG. 6 illustrates one possible embodiment of CSO cancellation logic in a receiver. This embodiment provides a vehicle for the description of automatic CSO cancellation in a receiver. Those skilled in the art will appreciate that other receiver configurations could be made to operate with this cancellation methodology. Other configurations that might be employed include a purely diode configured CSO generator. Furthermore, the devices, systems, and methodologies described herein are not limited to just CSO cancellation, and may be applied for example to composite triple beat (CTB) cancellation as well.

In many cases, the need for CTB cancellation limits the output capability of optical transmitters. Such transmitters clip the output signal when the laser turns off, or, in the case of externally modulated transmitters, when the external modulator saturates. CTB compensation in such transmitters eliminates smooth compression of the signals, such that the signals are linear as a function of input signal, and then clip when the limit is reached. When less CTB compensation is applied on transmitters on purpose, a smoother roll into compression is tolerated. This allows a higher drive level into the transmitters before the light output is clipped, thus reaching a higher signal to noise ratio. This typically comes at the expense of a higher transmitter CTB output level. However, in combination with a distortion-compensating receiver that compensates this CTB, there is reduced detrimental effect at the receiver output, and the CNR enhancement is still obtained.

In most multi-carrier modulated systems, the effective modulation index is low, on the order of 20% of the transmitter light output, and thus allowing smooth compression at high modulation index affects the signals in statistically rare occasions when the optical modulation approaches 100%. For most of the signal content, allowing smooth transmitter compression does not affect the signal. Only at large signal excursions is there a significant effect resulting in distortions that may be compensated by the receiver.

In the embodiment of FIG. 6, input phase logic 606 provides a signal to CSO logic 604, which monitors the CSO level and produces a counter-distortion signal. The counter distortion signal is provided to the output phase logic 602.

Figure 7:
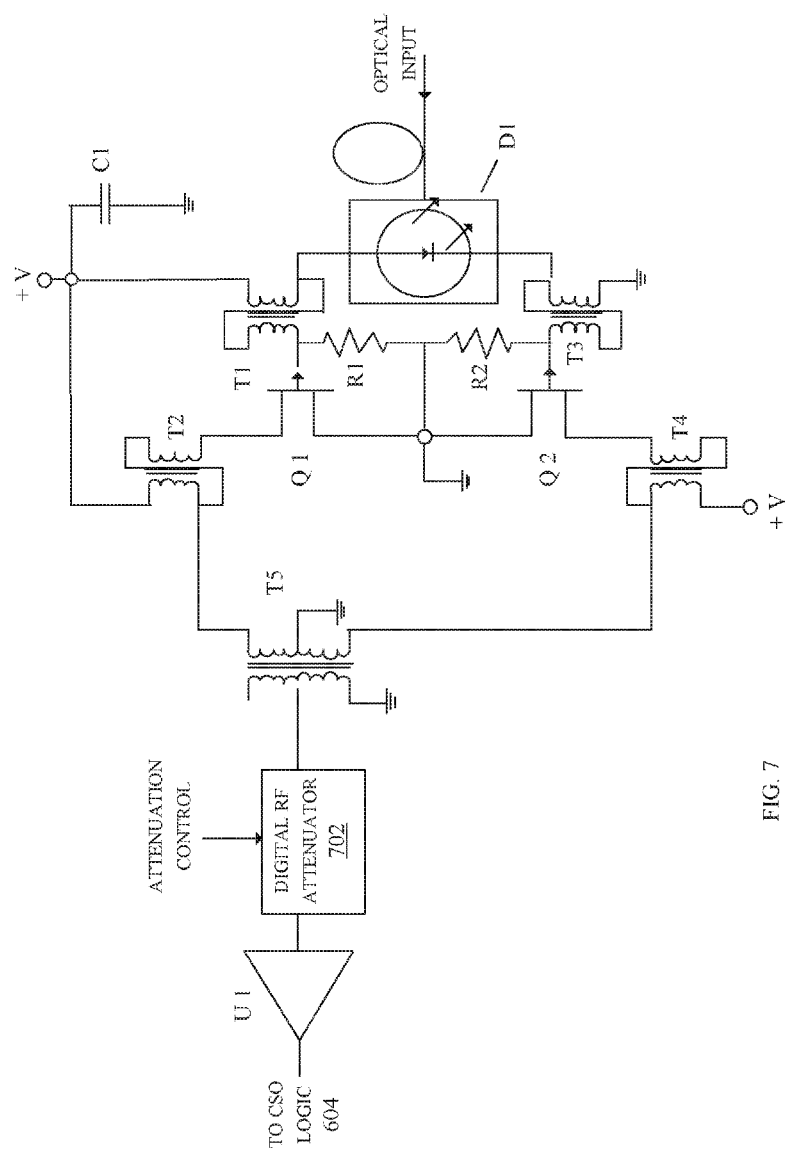
FIG. 7 is a block diagram illustration of an embodiment of input phase logic.

FIG. 7 is a block diagram illustration of an embodiment of input phase logic 606. A photodiode D1 converts the optical signal and its corresponding optical distortions to RF electrical signals. The RF output signals and the distortion components from the Photo-detector are first amplified by the RF input amplifier consisting of components Q1, Q2, resistors R1 and R2, capacitor C1, and transformers T1 through T5. Resistors R1 and R2 provide the bias voltage for Q1 and Q2. Capacitor C1 decouples power supply noise from the circuit. Is some embodiments T1 and T3 are rated 50 mV/mW. This balanced configuration is employed to provide second order reduction of the RF distortion components that are generated in this particular amplifier stage.

The output of this amplifier stage is provided to a digitally controlled RF attenuator 702. In some embodiments the attenuator 702 provides attenuation from 0 to −31.5 dB in 0.5 dB steps. The attenuator 702 provides an end user the ability to set the nominal RF output level of the receiver to be a particular value over any part of the normal optical input power range. The output of the attenuator 702 is typically fairly constant, independent of the particular fixed optical input power that results from the initial link set-up. The output of the attenuator 702 is coupled to a post amplifier, U1, that boosts the RF signal to a sufficient level to adequately drive the output stage 602.

Referring again to FIG. 6, another attenuator, 608, attenuates the RF signal to a sufficient level to adequately drive the CSO pre-distortion generator in the CSO logic 604. The attenuator 608 sets the optimum input operating point of the distortion generator of CSO logic 604, to provide the best distortion signal for cancellation purposes. An RF coupler T11 follows the input stage logic 606 to sample the signal and feed it to the distortion generator of the CSO logic 604. The distortion generator comprises amplifiers U11, U10, transformer T6, and 0 degree Combiner 612. The signal path continues through the Main Delay Line and the coupler T12 to the output stage logic 602.

Figure 8:
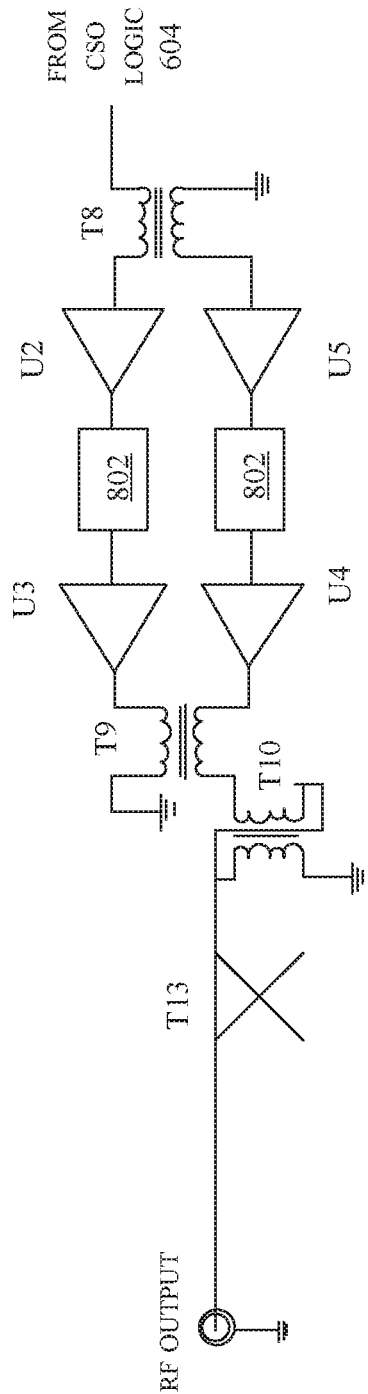
FIG. 8 is a block diagram illustration of an embodiment of output phase logic.

Referring to FIG. 8, one embodiment of output stage logic 602 comprises amplifiers U2, U3, U4, U5, and transformers T8, T9, and T10. The blocks 802 represent signal loss attributed to the components needed to impedance match U2 to U3 and U5 to U4. A balanced configuration is also used here to minimize the CSO contribution of the output amplifiers. The signal output from T10 is provided to coupler T13 before reaching the RF output. T13 samples the signal to allow for the monitoring of both the receiver output level at an RF test point (see FIG. 6), and also the CSO distortion level present in the signal itself through the use of the additional coupler T14. An attenuator 610 that follows T14 sets the desired signal level at the test point. (see FIG. 6).

Referring again to FIG. 6, sampling of the CSO distortion at the output of the CSO logic 604 is accomplished via coupler T14. The sampled distortion is provided to a 6.00 Mhz narrow band-pass filter 614. This filter removes much of the carrier frequency energy above 6 MHz. This prevents overloading the front-end of the distortion-monitor amplifier U7 and square-law detector 616 (comprising diodes D2 and D3), and filter/amplifier U8. D3 is identical to D2 and is provided to balance out the temperature associated changes in bias voltage associated with D2. This feature maintains temperature stability of the DC output voltage of U8. The total carrier energy is typically 60 to 70 dB greater than the distortion products to be monitored, so removing this energy prevents distortion monitor overload.

The output of the narrow band-pass filter supplies a low-noise RF pre-amplifier U7. U7 provides distortion gain and establishes the signal to noise ratio (SNR) of the distortion monitor/control loop. The output of U7 feeds the detector 616 operating in its square law region to transform the 6.00 Mhz CSO RF distortion components into a proportional DC voltage. Detector 616 is coupled to the low-pass filter/amplifier U8 which in turn is coupled to one of the input analog-to-digital converters 618 of microprocessor U9. U9 may operate the processor 620 to perform CSO distortion reduction in accordance, for example, with the technique described in conjunction with FIG. 4.

An embodiment of a distortion monitor circuit comprises RF coupler T14, narrow band-pass-filter 614, pre-Amplifier U7, and square-law detector/amplifier 616 and U8. This monitor circuit samples the received signal spectrum for the particular adjacent frequency distortion components, in this particular example the 6.00 Mhz components. The magnitude of the monitor's output signal is a measure of the 6.00 Mhz CSO distortion performance of the system. The CSO logic 604 automatically controls the magnitude of the distortion components sampled at the output of the receiver, and also indirectly reduces the +/−1.25 Mhz components of the distortion of interest.

A distortion minimization command word that the microprocessor U9 generates may be converted to a DC level by one of the digital-to-analog converters (DACs) 622. This DC voltage is converted to a source current by transistors Q3 and Q4 that bias a configuration of current-starved RF amplifiers U11, U10 that are designed to purposely generate second order (CSO) distortion products. The frequency signature of these distortion products is shaped by the CSO equalizer to better match the frequency signature of the received distortion products. The equalizer can be made to address specific components of distortion to cancel only those resulting from fiber dispersion effects, or may be made broadband to cover all distortion components.

The generated distortion is then delayed by both the CSO delay line and the variable phase control logic 624, which, together with the main delay line, ensure that the received distortion products and the generated distortion product are of opposite phase when they combine at the CSO correction loop output coupler T12. An amplitude equalizer 626 adjusts the amplitude of the generated distortion to match the level of the received distortion at T12. Amplitude matching and the opposing phase of the generated distortion result in a net receiver output signal with CSO distortion reduced by up to 20 dB across a wide frequency band.

The microprocessor U9 continuously samples distortion levels and continuously adjusts the CSO generator bias current to amplifiers U11 and U10 until the CSO distortion is at a minimum, for example as described in conjunction with FIG. 4, above. A phase adjustment 628 provides a phase shift in support of the technique embodiment of FIG. 5.

Those having skill in the art will appreciate that there are various logic implementations by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. An optical receiver having composite second order (CSO) distortion correction logic for reducing receiver distortion in a received signal during operation of a cable television (CATV) optical system via a closed-loop operation, the correction logic comprising:
    a monitor circuit for sampling received signals delayed by a first delay line combined with an output of a second delay line connected to an output of a composite second order (CSO) distortion generation circuit circuit for composite second order distortion;
    a composite second order distortion detector for measuring a combination of received distortion products and generated distortion products in the output of the composite second order (CSO) distortion generation circuit in the sampled signals, the received distortion products attributable to at least laser distortion or optical fiber distortion generated during operation of the CATV optical system;
    a microprocessor configured to adjust a control voltage input to the composite second order (CSO) distortion generation circuit during the closed-loop operation, wherein the control voltage input to the CSO distortion generation circuit during the closed-loop operation is in response to a determination whether a direction of control voltage change made previously during the closed-loop operation results in less distortion detected by the distortion detector,
    wherein the CSO distortion generation circuit generates distortion products having a frequency signature shaped to correspond to a frequency signature of the received distortion products; and
    the second delay line for outputting the generated distortion products caused by the second delay line to be out of phase with the received distortion products, said output of the second delay line for combination with signals delayed by the first delay line.

2. The optical receiver of claim 1, wherein the closed-loop composite second order (CSO) distortion correction logic generates distortion products for composite triple beat (CTB) distortion correction.

3. The optical receiver of claim 1, wherein the correction logic is configured to detect poorly correlated CSO distortion contributions.

4. The optical receiver of claim 1, wherein the monitoring circuit of the closed-loop composite second order (CSO) distortion correction logic is configured to sample CSO distortion of signals input to the monitor circuit, and the microprocessor is configured to adjust a distortion applied to the receiver output signal, according to the sampled CSO distortion.

5. The optical receiver of claim 1, wherein the second delay line of the closed-loop composite second order (CSO) distortion correction logic is configured to automatically apply a phase shift to a distortion signal applied to the receiver output signal, the phase shift minimizing an overall distortion of the receiver output signal.

6. The optical receiver of claim 1, wherein the closed-loop composite second order (CSO) distortion correction logic further comprises an attenuator for setting an input operating point of the distortion generator for generating the distortion products.

7. The optical receiver of claim 1, wherein the closed-loop composite second order (CSO) distortion correction logic generates the distortion products based on an initial signal received by the receiver for feed-forward distortion correction.

8. An optical communication system for reducing receiver distortion during operation of a cable television (CATV) optical system via a closed-loop operation, the system comprising:
- a transmitter comprising nontransitory open-loop composite second order (CSO) distortion correction logic; and
- a receiver for receiving a received signal, the receiver having composite second order (CSO) distortion correction logic, comprising:
  - a monitor circuit for sampling received signals delayed by a first delay line combined with an output of a second delay line connected to an output of a composite second order (CSO) distortion generation circuit circuit for composite second order distortion;
  - a composite second order distortion detector for measuring a combination of received distortion products and generated distortion products in the output of the composite second order (CSO) distortion generation circuit in the sampled signals, the received distortion products attributable to at least laser distortion or optical fiber distortion generated during operation of the CATV optical system;
  - a microprocessor configured to adjust a control voltage input to the composite second order (CSO) distortion generation circuit during the closed-loop operation, wherein the control voltage input to the CSO distortion generation circuit during the closed-loop operation is in response to a determination whether a direction of control voltage change made previously during the closed-loop operation results in less distortion detected by the distortion detector,
  - wherein the CSO distortion generation circuit generates distortion products having a frequency signature shaped to correspond to a frequency signature of the received distortion products; and
  - the delay line for combining the received distortion products and the generated distortion products caused to be out of phase with the received signal to produce delayed signals input to the monitor circuit.

9. The optical communication system of claim 8, wherein the correction logic also generates distortion products for composite-triple beat (CTB) distortion correction.

10. The optical communication system of claim 8, wherein the monitoring circuit of the closed-loop composite second order (CSO) distortion correction logic is configured to sample CSO distortion of signals input to the monitor circuit, and the microprocessor is configured to adjust a distortion applied to the receiver output signal, according to the sampled CSO distortion.

11. The optical communication system of claim 8, wherein the second delay line of the closed-loop composite second order (CSO) distortion correction logic is configured to automatically apply a phase shift to a distortion signal applied to a receiver output signal, the phase shift minimizing an overall distortion of the receiver output signal.

12. The optical communication system of claim 8, wherein the transmitter comprising open-loop composite second order (CSO) distortion correction logic corrects for laser distortions but not fiber-induced distortions or optical passives induced distortions.

13. The optical communication system of claim 8, wherein the transmitter comprising open-loop composite second order (CSO) distortion correction corrects for laser distortions and optical passives induced distortions but not fiber-induced distortions.

14. The optical communication system of claim 8, wherein the transmitter comprising open-loop composite second order (CSO) distortion correction logic corrects for laser distortions and not fiber-induced distortions but not optical passives induced distortions.

15. The optical communication system of claim 8, wherein the closed-loop composite second order (CSO) distortion correction logic further comprises an attenuator setting an input operating point of the distortion generator.

16. The optical communication system of claim 8, wherein the closed-loop composite second order (CSO) distortion correction logic generates the distortion products based on an initial signal received by the receiver for feed-forward distortion correction.

17. A method in an optical communication system for composite second order (CSO) distortion correction, the method comprising:
- sampling signals previously output from the correction logic and added to a received signal for composite second order distortion;
- measuring a combination of received distortion products and generated distortion products in the sampled signal the sampled signals, the received distortion products attributable to at least laser distortion or optical fiber distortion generated during operation of the CATV optical system;
- adjusting a control voltage input to a composite second order (CSO) distortion generation circuit during a closed-loop operation, wherein the control voltage input to the CSO distortion generation circuit during the closed-loop operation is in response to a determination whether a direction of control voltage change made previously during the closed-loop operation results in less distortion,
- generating distortion products having a frequency signature shaped to correspond to a frequency signature of the received distortion products; and
- causing the received distortion products and the generated distortion products to be out of phase for combination with the received signal to produce delayed signals for outputting from the correction logic for said sampling.

18. The method claim 17, further comprising:
applying microprocessor controlled feed-forward distortion to the correction logic output.

19. The method claim 17, further comprising:
sampling CSO distortion of the output signal of the optical receiver, and adjusting a distortion generator applied to the output signal, according to the sampled CSO distortion.

20. The method claim 17, further comprising:
automatically applying a phase shift to a distortion signal applied by the correction logic, the phase shift minimizing an overall distortion of the receiver output.

21. The method claim 17, wherein the correction logic generates distortion products for composite triple beat (CTB) distortion correction of the receiver output.

* * * * *